(12) United States Patent
Wong et al.

(10) Patent No.: US 7,250,084 B2
(45) Date of Patent: Jul. 31, 2007

(54) DOWNWARD MECHANISM FOR SUPPORT PINS

(75) Inventors: Ching-Hong Wong, Miaoli Hsien (TW); Hsi-Ming Chang, Chang Hua Hsien (TW)

(73) Assignee: Chunghwa Picture Tubes, Ltd, Taipei (TW)

(*) Notice: Subject to any disclaimer, the term of this patent is extended or adjusted under 35 U.S.C. 154(b) by 374 days.

(21) Appl. No.: 10/824,433

(22) Filed: Apr. 15, 2004

(65) Prior Publication Data

US 2005/0016469 A1    Jan. 27, 2005

(30) Foreign Application Priority Data

Jul. 22, 2003   (TW) ............... 92120016 A

(51) Int. Cl.
*C23C 16/00* (2006.01)
*H01L 21/00* (2006.01)

(52) U.S. Cl. ............... 118/728; 156/345.23; 414/935; 414/936; 414/941

(58) Field of Classification Search ............... 118/728; 156/345.23; 414/935, 936, 941; 269/13, 269/21
See application file for complete search history.

(56) References Cited

U.S. PATENT DOCUMENTS

| | | | | |
|---|---|---|---|---|
| 6,104,002 A | * | 8/2000 | Hirose et al. | 219/390 |
| 6,435,798 B1 | * | 8/2002 | Satoh | 414/217 |
| 6,683,378 B2 | * | 1/2004 | Wing et al. | 257/726 |
| 7,014,415 B2 | * | 3/2006 | Yoshizawa | 414/797.5 |
| 2004/0219006 A1 | * | 11/2004 | Tran et al. | 414/936 |

* cited by examiner

*Primary Examiner*—Parviz Hassanzadeh
*Assistant Examiner*—Sylvia MacArthur
(74) *Attorney, Agent, or Firm*—Hoffman, Wasson & Gitler, PC

(57) ABSTRACT

A downward mechanism for support pins is applicable to a reactor of removable type. Support pins are located on the base of the reactor, and each support pin has a base thereunder. The downward mechanism has an elevator mechanism and a board fixed thereto. The board has several holes for the pin and the base to pass respectively therethrough. Each hole elongates into a slit allowing each of the support pins, only, to pass respectively therethrough.

4 Claims, 6 Drawing Sheets

DOWNWARD MECHANISM FOR SUPPORT PINS

BACKGROUND OF THE INVENTION

1. Field of Invention

The present invention relates to a transmittal mechanism for a support apparatus. More particularly, the present invention relates to a downward mechanism for support pins.

2. Description of Related Art

For both semiconductor integrated circuits and flat display panels, many reactors used in the manufacturing process are designed as removable reactors of single or multiple-stacked type. Removable reactors and the main body of machines or removable reactors and the transmittal mechanisms, support pins, can be disengaged. The transmittal mechanism of the support pins for supporting a work piece, such as a silicon substrate used in semiconductor integrated circuits or a glass substrate used in flat display panels, is an indirect transmittal mechanism and can be disengaged from the support pins.

Conventionally, a substrate is transported into or out of a reactor by transmittal mechanism using support pins. FIGS. 1A–1E are diagrams showing the whole transmittal action performed by a transmittal mechanism using support pins for a conventional chemical vapor deposition reactor. In FIG. 1A, a substrate 100 is carried by a robot 110 and prepared to enter a reactor. A bottom plate 120 of the reactor has some holes 130 therein to allow support pins 140, which have bases 150 thereunder, to enter the reactor through holes 130. In FIG. 1B, the robot 110 transports the substrate 100 into the reactor, and an elevator (not shown in the figure), shores up the bases 150 to lift the support pins 140 up. The support pins 140 penetrate the bottom plate 120 through the holes 130 to raise the substrate 100. In FIG. 1C, the robot 110 moves out of the reactor, and the substrate 100 is left in the reactor. The elevator then descends; the support pins 140 can thus be lowered by the weight of the support pins 140 and the bases 150.

In FIG. 1D, a thin film is formed on the substrate 100 by chemical vapor deposition, and then the elevator then rises to shore up the bases 150 and lift the support pins 140. The substrate 100 is hence raised again. Then, the robot 110 enters the reactor at the downward direction of the substrate 100 to load the substrate 100. In FIG. 1E, the robot 110 carries the substrate 100 out of the reactor. The elevator then descends to lower the support pins 140.

During the process of transporting substrate 100 into and out of the reactor, since the support pins 140 cannot be fixed to the elevator, the support pins 140 and bases 150 are not lowered directly by the elevator. Therefore, the support pins often do not descend smoothly, and the substrate 100 is thus often fragmented.

In Taiwan Utility Model Patent Number 521,861, two steel lines are used to improve the problem described above. However, the steel lines are often deformed, and the bases underneath the support pins are thus not buckled. Consequently, the support pins still do not descend smoothly.

SUMMARY OF THE INVENTION

In one aspect, the present invention provides a downward mechanism for support pins to reduce the condemnation number and increase yield.

In another aspect, the present invention provides a downward mechanism for support pins to decrease fragmentation and to increase the operation time of reaction chambers.

In accordance with the foregoing and other aspects of the present invention, a downward mechanism for support pins applied in a removable reactor is provided. A bottom plate of the removable reactor has support pins standing on bases, and the bases have a larger diameter than that of the pins. The downward mechanism comprises an elevator and a board. The board is fixed to the elevator at a fixed height. Holes having at least one slit extending therefrom are used to accommodate the support pins, respectively. Each hole is large enough to allow a base to pass therethrough, and the width of the slits is between the diameter of the support pins and that of the base.

In accordance with the foregoing and other aspects of the present invention, a downward mechanism for support pins applied in a removable reactor is provided. A bottom plate of the removable reactor has support pins standing on bases, and the bases have a larger diameter than that of the pins. The downward mechanism comprises an elevator, a first board and a second board. The first board and the second board are fixed to the elevator at a fixed height. A first side of the first board has first gaps, and a first side of the second board has second gaps. The first side of the first board neighbors on the first side of the second board at a distance to form a slit therebetween and allow the first gaps and the second gaps to align with each other to form holes for respectively accommodating support pins. Each hole is large enough to allow the base to pass therethrough, and the width of the slit is between the diameter of the support pins and that of the base.

As embodied and broadly described herein, the preferred embodiments of the invention utilize the hard-to-be-deformed feature of a board as a downward mechanism for the support pins to solve the problem of the support pins not dropping smoothly. Hence, the substrate fragmentation problem caused by rough transportation can be effectively solved to decrease the condemnation number and increase the operating time of manufacturing machines.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the preferred embodiment, with reference made to the accompanying drawings as follows.

DESCRIPTION OF THE PREFERRED EMBODIMENTS

Figure 1A:
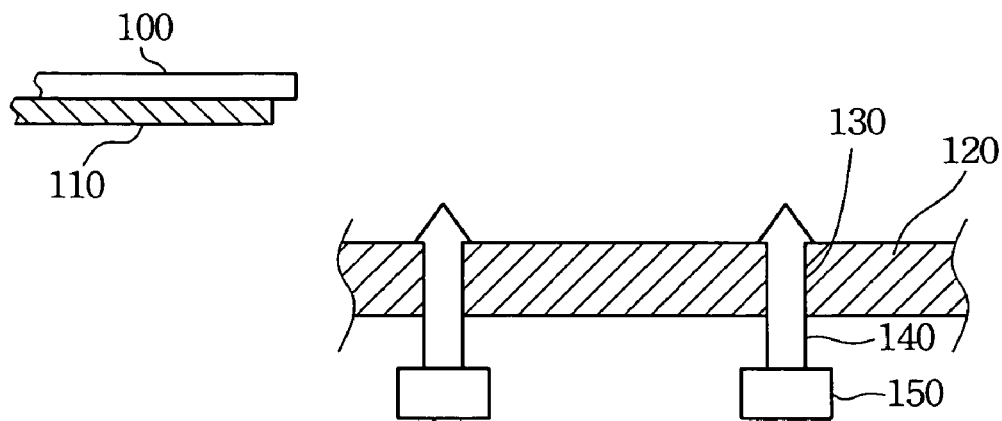
FIGS. 1A–1E are diagrams showing the whole transmittal actions performed by a transmittal mechanism using support pins for a conventional chemical vapor deposition reactor.
Figure 1B:
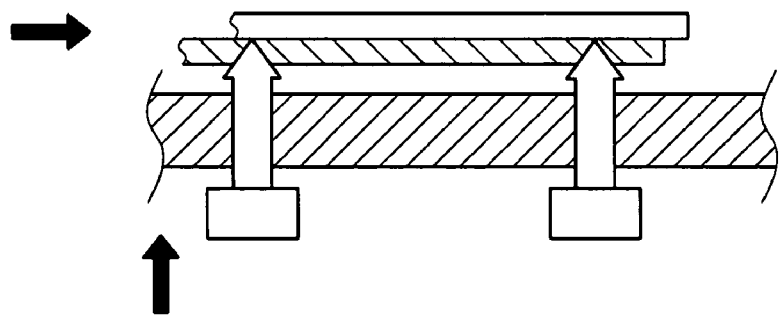
Figure 1C:
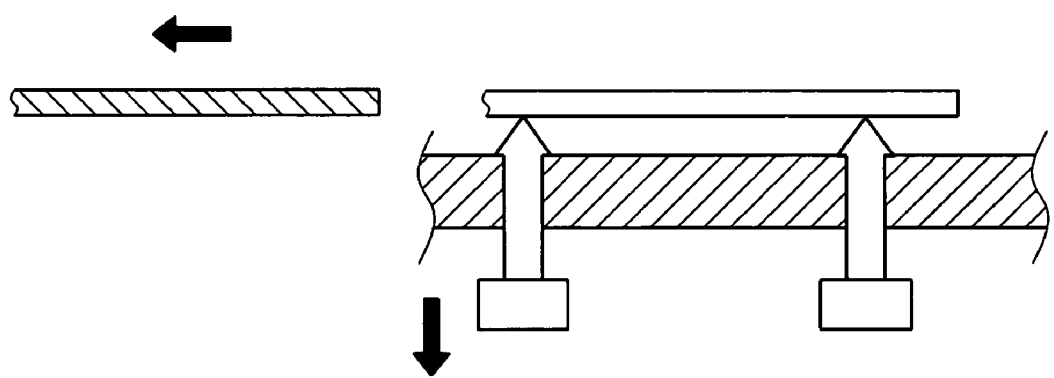
Figure 1D:
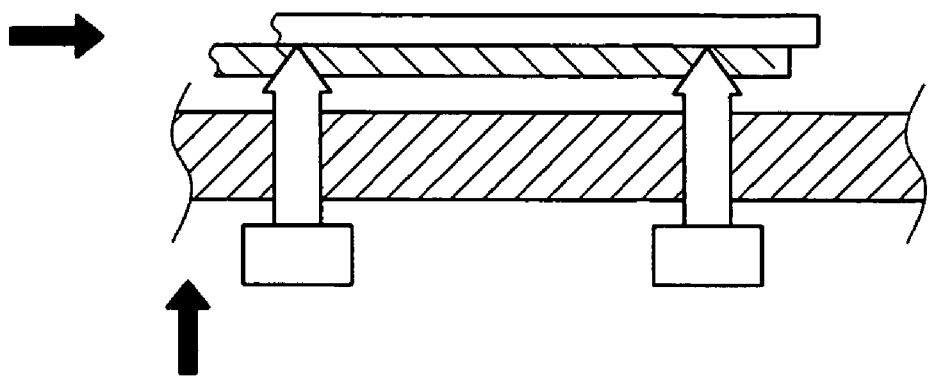
Figure 1E:
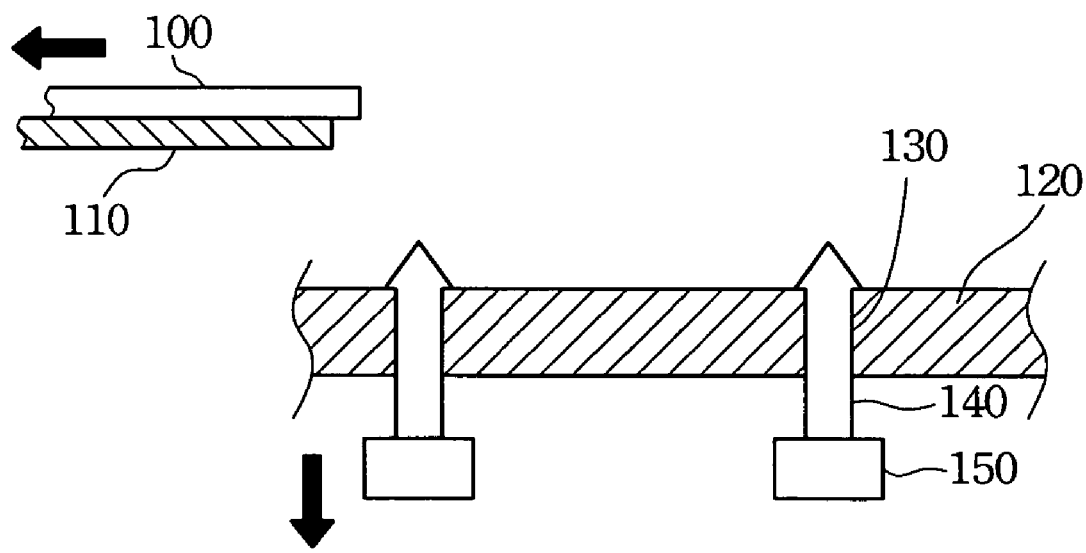

Reference will now be made in detail to the present preferred embodiments of the invention, examples of which are illustrated in the accompanying drawings. Wherever possible, the same reference numbers are used in the drawings and the description to refer to the same or like parts.

To resolve the problem of substrate fragmentation caused by the support pins not dropping smoothly, this invention provides a downward mechanism for the support pins to descend smoothly. Hence, the fragmentation number can be decreased and the operation time of manufacturing machine can be increased.

Figure 2:
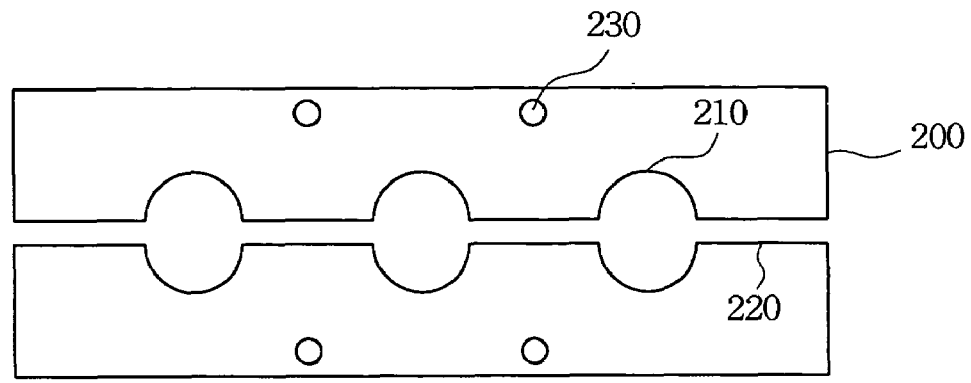
FIGS. 2–4 are diagrams showing a top view of a downward mechanism for support pins according to preferred embodiments of this invention.
Figure 3:
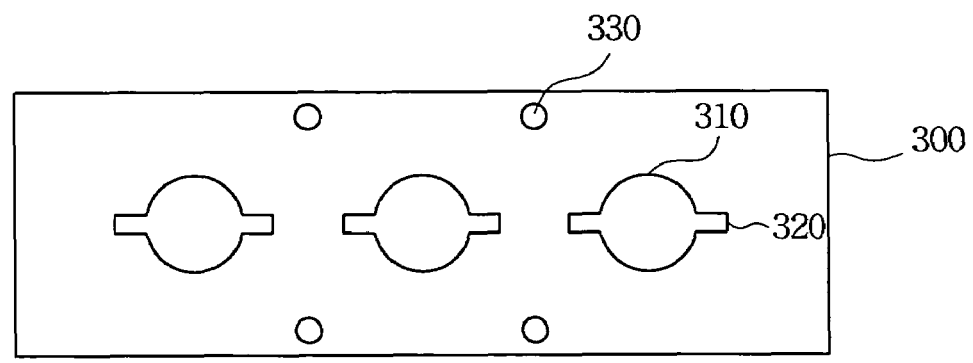
Figure 4:
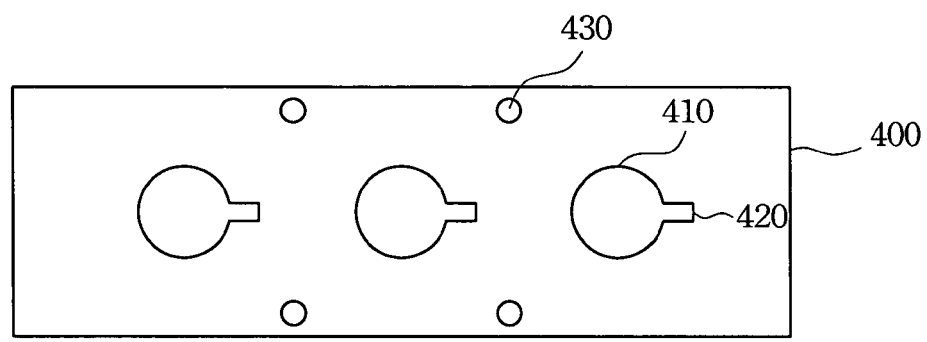
Figure 5A:
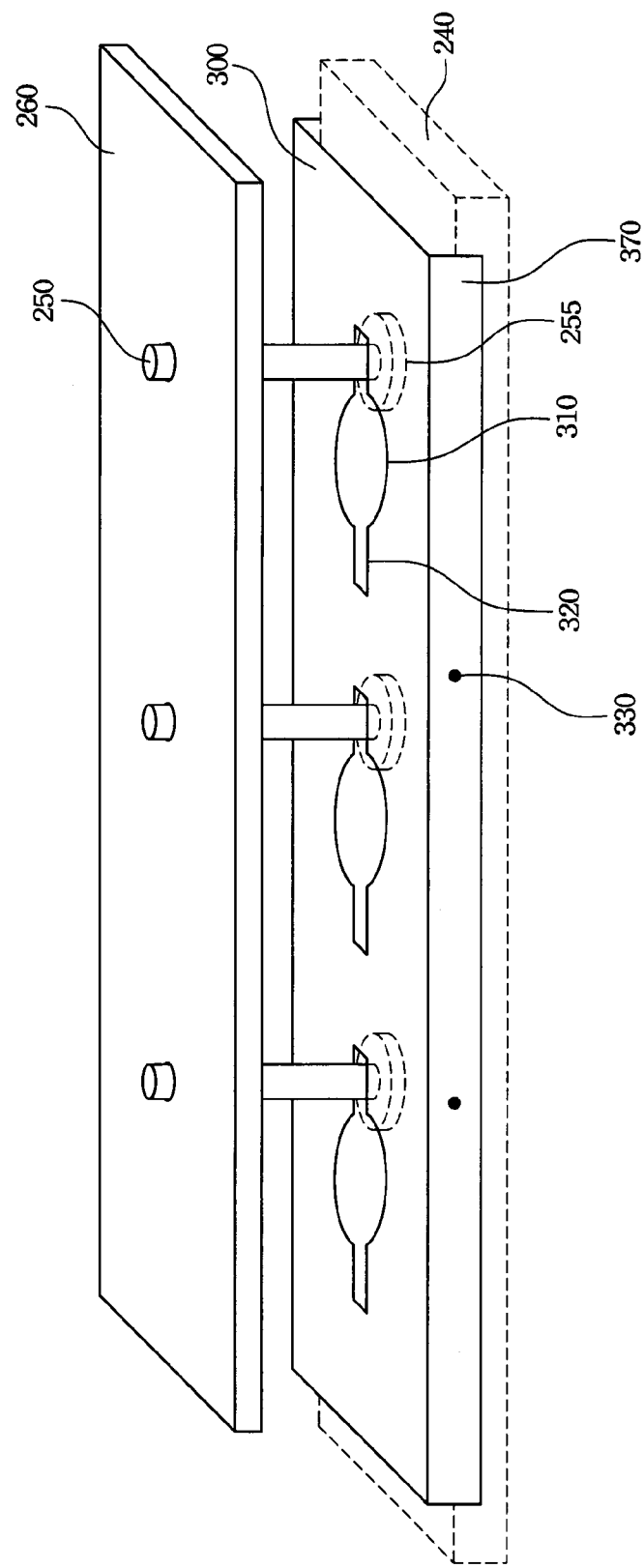
FIG. 5A is a diagram showing the downward mechanism showed in FIG. 3 affixed to an elevation mechanism.
Figure 5B:
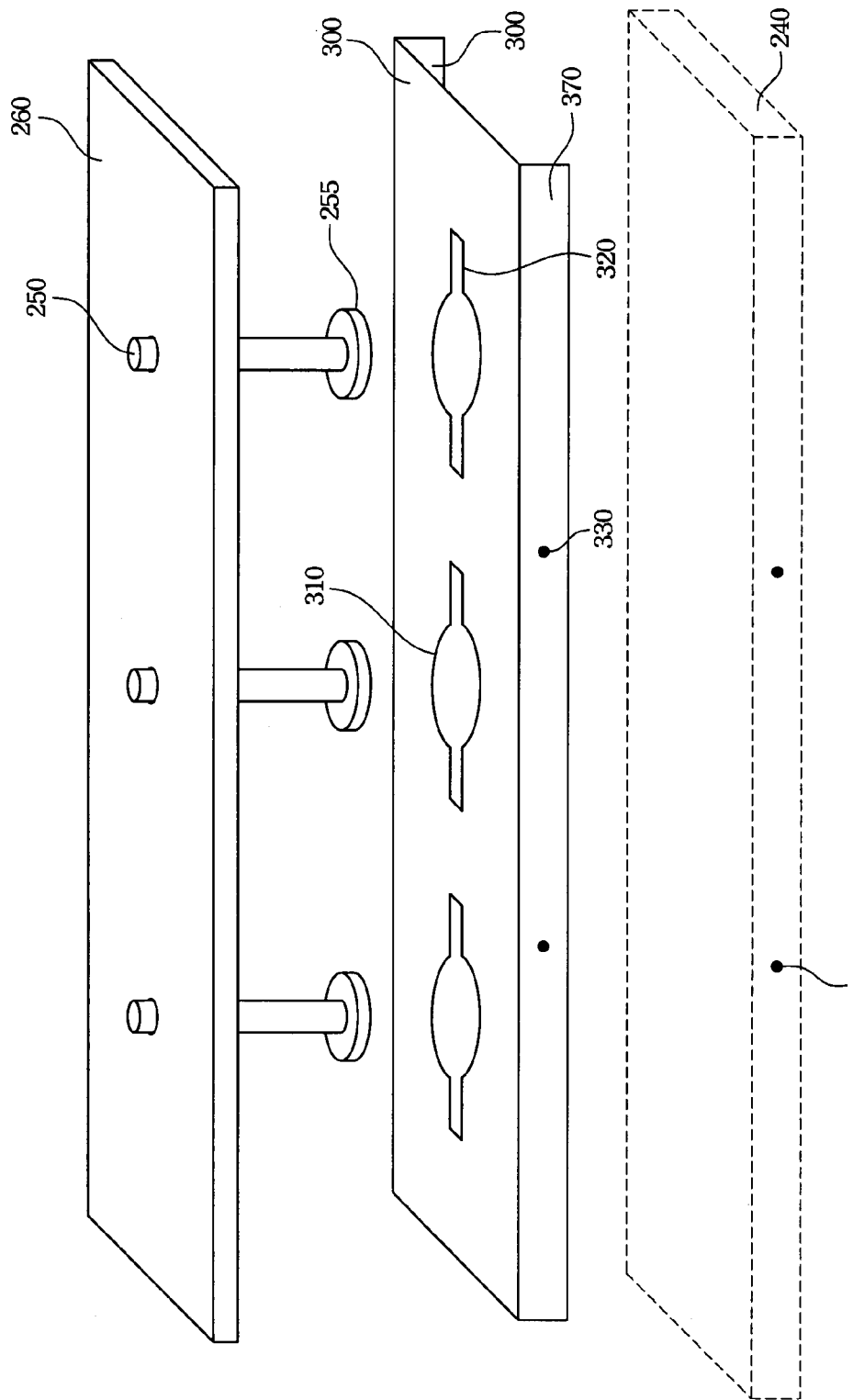
FIG. 5B is an exploded diagram of FIG. 5A.

FIGS. 2–4 are diagrams showing a top view of a downward mechanism for support pins according to preferred embodiments of this invention. In FIG. 2, two boards 200 having gaps 210 are assembled to form a downward mechanism for support pins. The two boards 200 are fixed to an elevator under the base beneath the support pins by a fixation apparatus 230 such as screws. A slit 220 is formed between the two boards 200.

Two gaps 210, respectively on two boards 200, form a hole. The diameter of the hole is larger than that of the bases, which are beneath the support pins, and the width of slit 220 is between the diameters of the bases and the support pins. Hence, the bases can penetrate the holes, assembled by two gaps 210, and move downward to be located below the holes. The support pins are thus located in the holes. The support pins together with the bases are then moved toward the slit 220 to locate the support pins in the slit 220, and the bases are located under the slit 220. The height of the downward mechanism can be determined by the height of the support pins. This can be achieved by attaching sidewalls, having a suitable height, to the outer edges of the two boards 200.

Accordingly, when the elevator under the bases ascends, the bases are shored up by the elevator to elevate the support pins without touching the downward mechanism, assembled by the two boards 200, for supporting a substrate. When the elevator descends, the two boards 200 of the downward mechanism press the bases to allow the support pins and thus the substrate to descend.

The structure of the downward mechanism described above can also be modified to other similar structures, such as those shown in FIGS. 3 and 4. In FIG. 3, a board 300 is used as the downward mechanism. Holes 310 having two slits 320 extending therefrom are formed in the board 300. The board 300 is fixed to the elevator under bases beneath support pins by fixation apparatus 330 such as screws. In FIG. 4, a board 400 is also used as the downward mechanism. Holes 410 having one slit 420 are formed in the board 400. The board 400 can also be fixed to the elevator under bases beneath support pins by fixation apparatus 430 such as screws. As described above, the diameters of the holes 310 and 410 are larger than that of the bases beneath the support pins to pass the bases, and the widths of the slits 320 and 420 are between the diameters of the bases and the support pins.

According to the preferred embodiments of this invention, the hard-to-be-deformed feature of a board is utilized as a downward mechanism for support pins to solve the problem of the support pins not dropping smoothly. Hence, the substrate fragmentation problem caused by rough transportation can be effectively solved to decrease the condemnation number and the increase the operating time of manufacturing machines.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A downward mechanism for support pins applied in a removable reactor, a bottom plate of the removable reactor having support pins standing on bases, respectively, the bases having a larger diameter than that of the pins, the downward mechanism comprising:
   an elevator;
   a board fixed to the elevator at a fixed height, the board having holes to accommodate the support pins, respectively, and at least a slit extending from each of the holes, a size of each hole being sufficiently large to allow base to pass therethrough and a width of the slits being between a diameter of the support pins and that of the base.

2. The downward mechanism of claim 1, wherein the fixed height is higher than a height of the base.

3. A downward mechanism for support pins applied in a removable reactor, a bottom plate of the removable reactor having support pins standing on bases, respectively, the bases having a larger diameter than that of the pins, the downward mechanism comprising:
   an elevator;
   a first board fixed to the elevator at a fixed height, a first side of the first board having first gaps; and
   a second board fixed to the elevator at the fixed height, a first side of the second board having second gaps respectively aligned with the first gaps to form holes for respectively accommodating support pins and neighboring on the first board at a distance to form a slit between the first side of the first board and the first side of the second board, wherein a size of the holes is sufficiently large to allow the base to pass therethrough and a width of the slits is between a diameter of the support pins and that of the base.

4. The downward mechanism of claim 3, wherein the fixed height is higher than a height of the base.

* * * * *